(12) United States Patent
Chen et al.

(10) Patent No.: US 8,729,635 B2
(45) Date of Patent: May 20, 2014

(54) SEMICONDUCTOR DEVICE HAVING A HIGH STRESS MATERIAL LAYER

(75) Inventors: Kuan-Po Chen, Hsinchu (TW); Mu-Yi Liu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 846 days.

(21) Appl. No.: 11/335,341

(22) Filed: Jan. 18, 2006

(65) Prior Publication Data

US 2007/0164370 A1  Jul. 19, 2007

(51) Int. Cl.
*H01L 21/331* (2006.01)
*H01L 29/78* (2006.01)

(52) U.S. Cl.
CPC .................................. *H01L 29/7842* (2013.01)
USPC ........................................................ 257/369

(58) Field of Classification Search
CPC .................................................. H01L 29/7842
USPC .......... 257/261, 314, 315, E29.129, E21.179; 438/257, 636, 791, 792
See application file for complete search history.

(56) References Cited

U.S. PATENT DOCUMENTS

| | | | | |
|---|---|---|---|---|
| 4,126,880 A * | 11/1978 | Tamaki et al. | ................ | 257/633 |
| 4,663,827 A * | 5/1987 | Nakahara | ...................... | 438/301 |
| 5,956,584 A * | 9/1999 | Wu | ................ | 438/232 |
| 6,235,456 B1 * | 5/2001 | Ibok | ................ | 430/512 |
| 6,461,985 B1 * | 10/2002 | Moore et al. | ................ | 438/791 |
| 6,924,241 B2 * | 8/2005 | Lee | ................ | 438/792 |
| 7,041,543 B1 * | 5/2006 | Varadarajan et al. | ......... | 438/197 |
| 7,057,237 B2 * | 6/2006 | Wang et al. | ................ | 257/344 |
| 7,118,999 B2 * | 10/2006 | Yang et al. | ................ | 438/586 |
| 2002/0177275 A1 * | 11/2002 | Liu et al. | ................ | 438/261 |
| 2004/0029323 A1 * | 2/2004 | Shimizu et al. | ................ | 438/142 |
| 2004/0166696 A1 * | 8/2004 | Lee | ................ | 438/792 |
| 2004/0173790 A1 * | 9/2004 | Yeo et al. | ................ | 257/19 |
| 2004/0251479 A1 * | 12/2004 | Tsutsui et al. | ................ | 257/249 |
| 2004/0253791 A1 | 12/2004 | Sun et al. | ................ | 438/308 |
| 2005/0032321 A1 | 2/2005 | Huang et al. | ................ | 438/301 |
| 2005/0145837 A1 * | 7/2005 | Chan et al. | ................ | 257/19 |
| 2005/0156208 A1 * | 7/2005 | Lin et al. | ................ | 257/288 |
| 2005/0247926 A1 * | 11/2005 | Sun et al. | ................ | 257/19 |
| 2006/0006420 A1 * | 1/2006 | Goto | ................ | 257/204 |
| 2006/0009041 A1 * | 1/2006 | Iyer et al. | ................ | 438/724 |
| 2006/0131672 A1 * | 6/2006 | Wang et al. | ................ | 257/410 |
| 2006/0160317 A1 * | 7/2006 | Zhu et al. | ................ | 438/322 |
| 2007/0096193 A1 * | 5/2007 | Forbes et al. | ................ | 257/315 |
| 2009/0045466 A1 * | 2/2009 | Nakamura | ................ | 257/369 |

FOREIGN PATENT DOCUMENTS

| | | |
|---|---|---|
| TW | 591798 | 6/2004 |
| TW | 594976 | 6/2004 |

OTHER PUBLICATIONS

Chinese Examination Report of Taiwan Application No. 095100865, dated on Jan. 9, 2008.

* cited by examiner

*Primary Examiner* — Ajay K Arora
(74) *Attorney, Agent, or Firm* — J.C. Patents

(57) ABSTRACT

A semiconductor device is provided. The semiconductor device comprises a substrate, a stacked gate structure, doped regions and high stress material layers. The stacked gate structure is located on the substrate. The stacked gate structure includes at least a dielectric layer and a gate sequentially disposed over the substrate. The doped regions are disposed in the substrate on each side of the stacked gate structure. The high stress material layers are disposed on the substrate to cover the doped regions. The high stress material layers can increase the mobility of the carriers in the doped regions and hence accelerate the operating speed of the device.

18 Claims, 2 Drawing Sheets

SEMICONDUCTOR DEVICE HAVING A HIGH STRESS MATERIAL LAYER

BACKGROUND OF THE INVENTION

1. Field of the Invention

The present invention relates to an integrated circuit. More particularly, the present invention relates to a semiconductor device and fabricating method thereof.

2. Description of the Related Art

In recent years, semiconductor materials have been used in all kinds of electronic industries due to its special conductive properties. The range of applications of semiconductor materials is wide. Many types of transistors, high voltage devices, logic devices and memory devices are fabricated using semiconductor materials. For example, non-volatile memory is one type of semiconductor device that has been widely used in personal computer systems and electron equipment because data can be stored, read out or erased many times and the stored data can be retained even after power is cut off.

In general, a non-volatile memory such as the silicon nitride read-only-memory is fabricated by forming an oxide-nitride-oxide (ONO) material layer over a substrate and then forming a doped polysilicon layer over the oxide-nitride-oxide material layer. Then, the doped polysilicon layer and the ONO material layer are patterned to form the gate (the doped polysilicon layer) and the ONO stacked structure underneath the gate. Finally, an ion implantation is carried out to implant ions into the substrate on each side of the ONO stacked structure to form a buried diffusion region that can serve as a buried bit line.

However, with the increase in the level of integration, the size of each memory device is also reduced. As a result, the length of the channel (the substrate region covered by the gate) in each memory device is also reduced. Since the dopants within the buried bit line formed by an ion implant process can easily diffuse when activated by a thermal processing operation, the effective length of the channel will be reduced leading to the occurrence of the so-called short channel effect.

In addition, the buried bit line (the doped region) has a moderately high resistance. After reducing the width of the buried bit line through miniaturization, the resistance will increase to an even higher level. One major consequence of having a higher resistance in the bit line is a drop in current during memory operation. The drop in current not only slows down the operation of the memory, but also wastes more electrical power. Moreover, the development of integrated circuits with a higher level of integration will certainly aggravate the aforementioned problem.

SUMMARY OF THE INVENTION

Accordingly, one aspect of the present invention is to provide a semiconductor device capable of increasing the mobility of carrier in a doped region and hence increase the operating speed of the device.

Another aspect of the present invention is to provide a method of fabricating a semiconductor device that can increase the mobility of carriers in a doped region, reduce the concentration of dopants needed to form the doped region and prevent the short channel effect.

To achieve these and other advantages and in accordance with the purpose of the invention, as embodied and broadly described herein, the invention provides a semiconductor device. The semiconductor device comprises at least a substrate, a stacked gate structure, doped regions and high stress material layers. The stacked gate structure is located on the substrate. The stacked gate structure includes at least a dielectric layer and a gate sequentially disposed over the substrate. The doped regions are disposed on each side of the stacked gate structure. The high stress material layers are disposed on the doped regions.

According to the semiconductor device in the preferred embodiment of the present invention, the high stress material layers comprise at least nitrogen and silicon. The high stress material layers are fabricated using a material selected from a group consisting of silicon nitride, silicon oxynitride, silicon oxide or a combination of the above, for example.

According to the semiconductor device in the preferred embodiment of the present invention, the semiconductor device can be a memory device. The stacked gate structure within the memory device comprises a dielectric layer, a charge-storage layer, a charge barrier layer and a gate sequentially disposed over the substrate, for example. The charge-storage layer can be fabricated using silicon nitride or polysilicon. The dielectric layer and the charge barrier layer can be fabricated using silicon oxide layer. Furthermore, the doped region within the memory device serves as a buried bit line.

According to the semiconductor device in the preferred embodiment of the present invention, the gate is fabricated using doped polysilicon. In addition, a conductive layer can be disposed on the gate of the semiconductor device. The conductive layer is a silicide layer, for example.

The present invention also provides a method of fabricating a semiconductor device. First, a stacked gate structure is formed on a substrate. The stacked gate structure comprises at least a dielectric layer and a gate sequentially stacked over the substrate. Next, doped regions are formed on the respective sides of the stacked gate structure. Finally, high stress material layers are formed to cover the doped region.

According to the method of fabricating the semiconductor device in the preferred embodiment of the present invention, the high stress material layers comprise at least nitrogen and silicon. The high stress material layers are fabricated using a material selected from a group consisting of silicon nitride, silicon oxynitride, silicon oxide or a combination of the above, for example. The method of forming the high stress material layers includes performing a chemical vapor deposition process. In the chemical vapor deposition process, the ratio between the nitrogen-containing gas and the silicon-containing gas are adjusted.

According to the method of fabricating the semiconductor device in the preferred embodiment of the present invention, the semiconductor device can be a memory device. The stacked gate structure within the memory device comprises a dielectric layer, a charge-storage layer, a charge barrier layer and a gate sequentially disposed over the substrate, for example. The charge-storage layer can be fabricated using silicon nitride or polysilicon. Furthermore, the doped region within the memory device serves as a buried bit line.

According to the method of fabricating the semiconductor device in the preferred embodiment of the present invention, the method of forming the doped regions includes performing an ion implant process using the stacked gate structure as a mask.

With the fabrication of a high stress material layer over the doped regions in the present invention, the mobility of the carriers within the doped regions is increased. Hence, the problem of having a high resistance and small current flows in the doped regions is improved. Since the setup of a high stress material layer can improve the mobility of carriers within the doped regions, the concentration of implant dopants in the process of forming the doped region can be reduced. As a result, short channel effect due to dopant diffusion can be minimized to provide the conditions necessary for increasing the level of integration of the devices.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
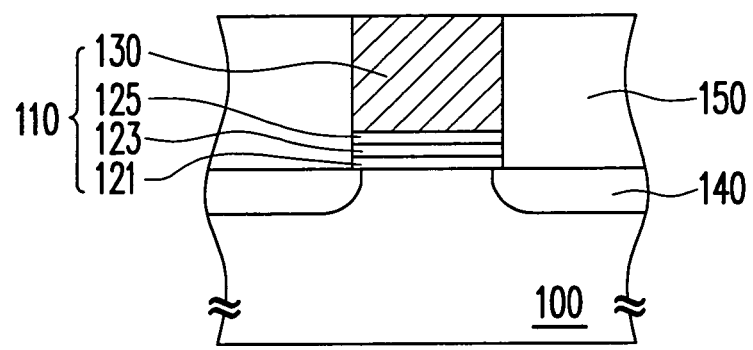
FIG. 1 is a schematic cross-sectional view showing the structure of a semiconductor device according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view showing the structure of a semiconductor device according to one preferred embodiment of the present invention. As shown in FIG. 1, the semiconductor device comprises at least a substrate 100, a stacked gate structure 110, doped regions 140 and high stress material layers 150.

The doped regions 140 are located in the substrate 100 on the respective sides of the stacked gate structure 110. The dopants inside the doped regions 140 can be P-type dopants or N-type dopants depending on the configuration of the device.

The high stress material layers 150 are disposed on the substrate 100 to cover the doped regions 140. The high stress material layers 150 comprise at least nitrogen and silicon. The material constituting the high stress material layers 150 is selected from a group consisting of silicon nitride, silicon oxynitride, silicon oxide and a combination of the above materials, for example. If the high stress material layers 150 are fabricated from silicon nitride material, the ratio between nitrogen and silicon is greater than or equal to 1.33. Because the amount of nitrogen in the silicon nitride material is higher, the stress within the high stress material layers 150 is increased. The stress within the high stress material layer 150 is higher than −7.28e7 (dynes/cm^2). The stress within the high stress material layer 150, for example, SiN, is preferably between a range of 1.53e7 (dynes/cm^2) at a dosage of 0.65% and 2.71e9 (dynes/cm^2) at a dosage of 20.35%. Using a conventional silicon oxide layer, the simulated mobility in the doped region 140 is found to 51.07 (cm^2/V-s). On the other hand, the simulated mobility in the doped region 140 of the present invention using the high stress material layer 150, for example, SiN, is between a range of 51.40 (cm^2/V-s) and 61.46 (cm^2/V-s). Thus, the mobility of the carriers within the doped regions 140 is enhanced.

The stacked gate structure 110 is located on the substrate 100. The stacked gate structure 110 comprises at least a dielectric layer 121 and a gate 130 sequentially disposed over the substrate 100. The dielectric layer 121 is fabricated using silicon nitride or other suitable dielectric material, for example. The gate 130 is fabricated using doped polysilicon, for example.

In one embodiment, the stacked gate structure 110 may comprise a dielectric layer 121, a charge-storage layer 123, a charge barrier layer 125 and a gate 130 sequentially disposed over the substrate 100. Here, the dielectric layer 121 serves as a tunneling dielectric layer and is fabricated using silicon oxide, for example. The charge-storage layer 123 is fabricated using silicon nitride, doped polysilicon or other material having the capacity to trap electric charges including tantalum oxide, strontium titanate and hafnium oxide, for example. The charge barrier layer 125 is fabricated using silicon oxide or other suitable material. The gate 130 is fabricated using doped polysilicon, for example. Furthermore, the aforementioned stacked gate structure 110 together with the doped regions 140 in the substrate 100 forms a memory device. In addition, the doped regions 140 inside the memory device may serve as a buried bit line. It should be noted that the high stress material layers 150 disposed over the buried bit line (the doped regions 140) can increase the mobility of the carriers within the buried bit line and hence increase the operating speed of the memory device.

Moreover, an additional conductive layer (not shown) can be disposed on the gate 130 of the semiconductor device. The conductive layer (not shown) is a silicide layer selected from a group consisting of tungsten silicide, titanium silicide, cobalt silicide and nickel silicide, for example. The conductive layer lowers the resistance of the gate 130 so that its capacity for conducting current is increased.

With the setup of a high stress material layer 150 over the doped region 140 in the semiconductor device, the mobility of carrier inside the doped region 140 is enhanced. For a memory device, the increase in carrier mobility also decelerates characteristic defects of having a high resistance and a low flowing current in the buried bit line (the doped region 140). As a result, there is an increase in the operating speed of the device and a simultaneous reduction in the power consumption.

Figure 2A:
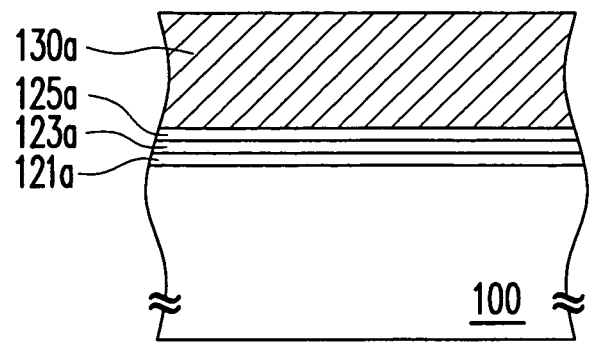
FIGS. 2A through 2C are schematic cross-sectional views showing the steps for fabricating a semiconductor device according to one preferred embodiment of the present invention.
Figure 2B:
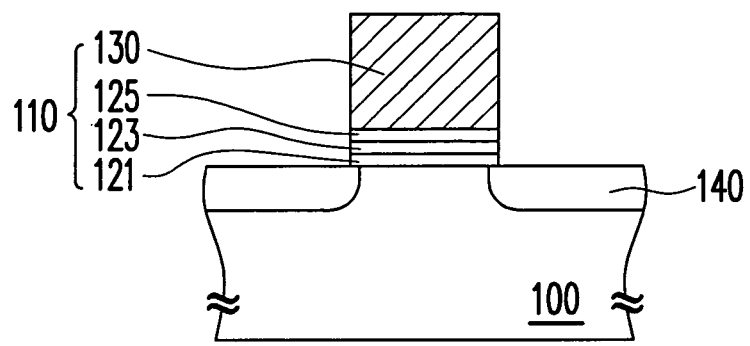
Figure 2C:
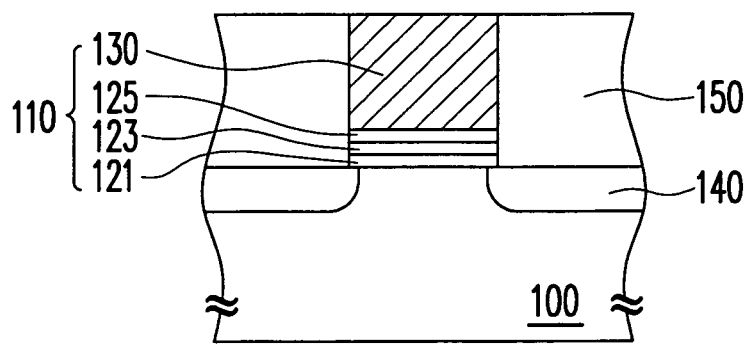

FIGS. 2A through 2C are schematic cross-sectional views showing the steps for fabricating a semiconductor device according to one preferred embodiment of the present invention.

As shown in FIG. 2A, a substrate 100 is provided. Then, a dielectric layer and a gate are sequentially formed over the substrate 100. In one embodiment, a dielectric material layer 121a, a charge-storage material layer 123a, a charge barrier material layer 125a and a gate material layer 130a are sequentially formed over the substrate 100 so that the ultimately formed semiconductor device serves as a memory device. The dielectric material layer 121a is a silicon oxide layer formed, for example, by performing a thermal oxidation process. The charge-storage material layer 123a is a silicon nitride layer formed, for example, by performing a chemical vapor deposition process. The charge barrier material layer 125a is a silicon oxide layer formed, for example, by performing a chemical vapor deposition process. Obviously, the dielectric material layer 121a and the charge barrier material layer 125a can be fabricated using other materials having similar properties. The charge-storage material layer 123a is not limited to a silicon nitride layer. Other materials having the capacity to trap electric charges, for example, doped polysilicon, tantalum oxide, strontium titanate or hafnium oxide can also be used to fabricate the charge-storage material layer 123a. The gate material layer 130a can be fabricated using doped polysilicon, for example. The gate material layer 130a is formed, for example, by performing a chemical vapor deposition process to form an undoped polysilicon layer and performing an ion implant process thereafter. Alternatively, the gate material layer 130a can be formed in a chemical vapor deposition process with in-situ dopant implant.

As shown in FIG. 2B, a stacked gate structure 110 is defined. The stacked gate structure 110 is defined on the substrate 100 by forming a patterned photoresist layer (not shown) over the gate material layer 130a. Then, using the patterned photoresist layer as a mask, an anisotropic etching operation is carried out to etch the gate material layer 130a, the charge barrier material layer 125a, the charge-storage material layer 123a and the dielectric material layer 121a in sequence. Thus, a stacked gate structure 110 comprising a gate 130, a charge barrier layer 125, a charge-storage layer 123 and a dielectric layer 121 is formed. The dielectric layer 121 also serves as a tunneling dielectric layer in the memory device.

In another embodiment, a conductive material layer (not shown) is formed over the gate material layer 130a after forming the gate material layer 130a shown in FIG. 1A before performing photolithographic and etching operations to form the patterned photoresist layer. The conductive material layer is a silicide layer selected from a group consisting of tungsten silicide, titanium silicide, cobalt silicide and nickel silicide, for example. The conductive material layer is formed, for example, by performing a chemical vapor deposition process or a self-aligned silicide process. The conductive layer is capable of lowering the resistance of the gate 130 and increasing the conductive capacity of the gate 130.

Next, a doped region 140 is formed in the substrate 100 on each side of the stacked gate structure 110. The method of forming the doped regions 140 includes performing an ion implant process using the stacked gate structure 110 as a mask. The dopants implanted into the substrate 100 can be P-type dopants or N-type dopants depending on the configuration of the device.

As shown in FIG. 2C, a high stress material layer 150 is formed over the substrate 100 to cover the doped regions 140. The high stress material layer 150 is fabricated using a compound of nitrogen and silicon such as silicon nitride, silicon oxynitride, silicon oxide or a combination of the above material, for example. The process of forming the high stress material layer 150 includes performing a chemical vapor deposition process to form a high stress material layer over the entire substrate 100 covering the stacked gate structure 110 and removing the high stress material layer over the stacked gate structure 110 thereafter. In particular, if the high stress material layer 150 is fabricated using silicon nitride material, then the ratio between the nitrogen-containing gas and the silicon-containing gas used in the chemical vapor deposition process can be adjusted to form a high stress material layer 150 with a nitrogen/silicon ratio of greater than or equal to 1.5.

In summary, the present invention provides a semiconductor device having a high stress material layer over the doped regions so that the mobility of the carriers within the doped regions is increased. Furthermore, with a higher carrier mobility, the problem of having a high resistance in the doped regions and small current flows in the buried bit line of a memory device is also avoided. Since the setup of the high stress material layer improves the mobility of carriers within the doped regions, the concentration of implant dopants in the process of forming the doped region can be reduced. As a result, short channel effect due to dopant diffusion can be minimized to provide the conditions necessary for increasing the level of integration of the devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate;
   a stacked gate structure disposed on the substrate, wherein the stacked gate structure comprises at least a dielectric layer and a gate sequentially stacked over the substrate with the gate being formed on the top-most position of the stacked gate structure;
   a doped region disposed on the respective sides of the stacked gate structure; and
   a high stress material layer disposed directly on an entire surface of the doped region exposed by the stacked gate structure, wherein a thickness of the high stress material layer along on an entire length of the entire surface of the doped region exposed by the stacked gate structure is substantially the same as a height of the stacked gate structure, and the high stress material layer on the doped region has a planar surface.

2. The semiconductor device of claim 1, wherein the high stress material with a stress is higher than −7.28e7 (dynes/cm^2).

3. The semiconductor device of claim 2, wherein the high stress material with a stress is-within a range of about 1.53e7 (dynes/cm^2) and 2.71e9 (dynes/cm^2).

4. The semiconductor device of claim 1, wherein the material constituting the high stress material layer is selected from a group consisting of silicon nitride, silicon oxynitride, silicon oxide or a combination of the above materials.

5. The semiconductor device of claim 1, wherein the stacked gate structure comprises the dielectric layer, a charge-storage layer, a charge barrier layer and the gate sequentially disposed over the substrate.

6. The semiconductor device of claim 5, wherein a material constituting the charge-storage layer comprises silicon nitride.

7. The semiconductor device of claim 5, wherein the material constituting the dielectric layer and the charge barrier layer comprises silicon oxide.

8. The semiconductor device of claim 1, wherein the doped region is a buried bit line.

9. The semiconductor device of claim 1, wherein the high stress material layer is constituted with a material comprising at least nitrogen and silicon, and a ratio of nitrogen-to-silicon of the material is greater or equal to 1.5.

10. A semiconductor device, comprising:
    a substrate;
    a stacked gate structure disposed on the substrate, wherein the stacked gate structure comprises at least a dielectric layer and a gate sequentially stacked over the substrate;
    a doped region disposed immediately adjacent to sidewalls of the dielectric layer and sidewalls of the gate of the stacked gate structure with the gate being formed on the top-most position of the stacked gate structure; and
    a high stress material layer disposed on an entire surface of the doped region exposed by the stacked gate structure and directly on the sidewalls of the dielectric layer and the sidewalls of the gate of the stacked gate structure, wherein an entire portion of the high stress material layer contacting the doped region has a substantially same stress characteristic, and a thickness of the high stress material layer along on an entire length of the entire surface of the doped region exposed by the stacked gate structure is substantially the same as a height of the stacked gate structure, and the high stress material layer on the doped region has a planar surface.

11. The semiconductor device of claim 10, wherein the high stress material layer has a substantially flat surface from a first portion of the high stress material layer directly contacting the stacked gate structure to a second portion of the high stress material layer far from the stacked gate structure.

12. The semiconductor device of claim 10, wherein the high stress material layer is constituted with a material comprising at least nitrogen and silicon, and a ratio of nitrogen-to-silicon of the material is greater or equal to 1.5.

13. The semiconductor device of claim 10, wherein the high stress material with a stress is-within a range of about 1.53e7 (dynes/cm^2) and 2.71e9 (dynes/cm^2).

14. The semiconductor device of claim 10, wherein the material constituting the high stress material layer is selected from a group consisting of silicon nitride, silicon oxynitride, silicon oxide or a combination of the above materials.

15. The semiconductor device of claim 10, wherein the stacked gate structure comprises the dielectric layer, a charge-storage layer, a charge barrier layer and the gate sequentially disposed over the substrate.

16. The semiconductor device of claim 15, wherein a material constituting the charge-storage layer comprises silicon nitride.

17. The semiconductor device of claim 15, wherein the material constituting the dielectric layer and the charge barrier layer comprises silicon oxide.

18. The semiconductor device of claim 10, wherein the doped region is a buried bit line.

* * * * *